(12) United States Patent
Kikuchi

(10) Patent No.: US 10,847,649 B2
(45) Date of Patent: Nov. 24, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Takuo Kikuchi, Kamakura (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/357,597

(22) Filed: Mar. 19, 2019

(65) Prior Publication Data

US 2019/0319125 A1 Oct. 17, 2019

(30) Foreign Application Priority Data

Apr. 17, 2018 (JP) .................. 2018-079323

(51) Int. Cl.
*H01L 29/78* (2006.01)
*H01L 29/51* (2006.01)
(Continued)

(52) U.S. Cl.
CPC ...... *H01L 29/7813* (2013.01); *H01L 21/0217* (2013.01); *H01L 21/02164* (2013.01);
(Continued)

(58) Field of Classification Search
CPC ........... H01L 29/7813; H01L 29/66348; H01L 29/4236; H01L 21/02329; H01L 21/76855;
(Continued)

(56) References Cited

U.S. PATENT DOCUMENTS

| 2005/0255706 A1 | 11/2005 | Ishida et al. |
| 2016/0197150 A1* | 7/2016 | Ariyoshi ........... H01L 21/02326 257/77 |
| 2018/0122894 A1* | 5/2018 | Kyogoku ............ H01L 29/0878 |

FOREIGN PATENT DOCUMENTS

| JP | H04-188877 A | 7/1992 |
| JP | H09-312395 A | 12/1997 |

(Continued)

*Primary Examiner* — Hsien Ming Lee
(74) *Attorney, Agent, or Firm* — Oblon, McClelland, Maier & Neustadt, L.L.P.

(57) ABSTRACT

According to one embodiment, a semiconductor device includes first, second, and third semiconductor regions, first, second, and third electrodes, and a first insulating portion. The first semiconductor region includes first and second partial regions. A first direction from the second partial region toward the second semiconductor region crosses a second direction from the second region toward the first partial region. The third semiconductor region is provided between the second partial region and the second semiconductor region in the first direction. The first insulating portion includes a first insulating region provided between the third semiconductor region and the first electrode in the second direction, a second insulating region provided between the first partial region and the first electrode in the first direction, and a third insulating region provided between the first partial region and the first insulating region in the first direction.

6 Claims, 8 Drawing Sheets

(51) Int. Cl.
*H01L 21/02* (2006.01)
*H01L 21/28* (2006.01)
*H01L 29/40* (2006.01)
*H01L 29/10* (2006.01)
*H01L 29/423* (2006.01)
*H01L 29/66* (2006.01)
*H01L 29/08* (2006.01)
*H01L 29/417* (2006.01)
*H01L 29/739* (2006.01)

(52) U.S. Cl.
CPC .... *H01L 21/28158* (2013.01); *H01L 29/0865* (2013.01); *H01L 29/0882* (2013.01); *H01L 29/1033* (2013.01); *H01L 29/1095* (2013.01); *H01L 29/401* (2013.01); *H01L 29/41741* (2013.01); *H01L 29/4236* (2013.01); *H01L 29/511* (2013.01); *H01L 29/518* (2013.01); *H01L 29/66348* (2013.01); *H01L 29/66734* (2013.01); *H01L 29/7397* (2013.01)

(58) Field of Classification Search
CPC ... H01L 29/7397; H01L 29/511; H01L 29/518
See application file for complete search history.

(56) References Cited

FOREIGN PATENT DOCUMENTS

| | | |
|---|---|---|
| JP | 2001-210821 A | 8/2001 |
| JP | 2004-158603 | 6/2004 |
| JP | 2005-327799 | 11/2005 |
| JP | 2009-212299 A | 9/2009 |
| JP | 2010-003828 A | 1/2010 |
| JP | 2011-233701 A | 11/2011 |
| JP | 2013-069791 A | 4/2013 |
| JP | 2014-154667 A | 8/2014 |

* cited by examiner

SEMICONDUCTOR DEVICE

CROSS-REFERENCE TO RELATED APPLICATIONS

This application is based upon and claims the benefit of priority from Japanese Patent Application No. 2018-079323, filed on Apr. 17, 2018; the entire contents of which are incorporated herein by reference.

FIELD

Embodiments described herein relate generally to a semiconductor device.

BACKGROUND

An embodiment of the invention provides a semiconductor device in which the characteristics can be stabilized.

DETAILED DESCRIPTION

Figure 1:
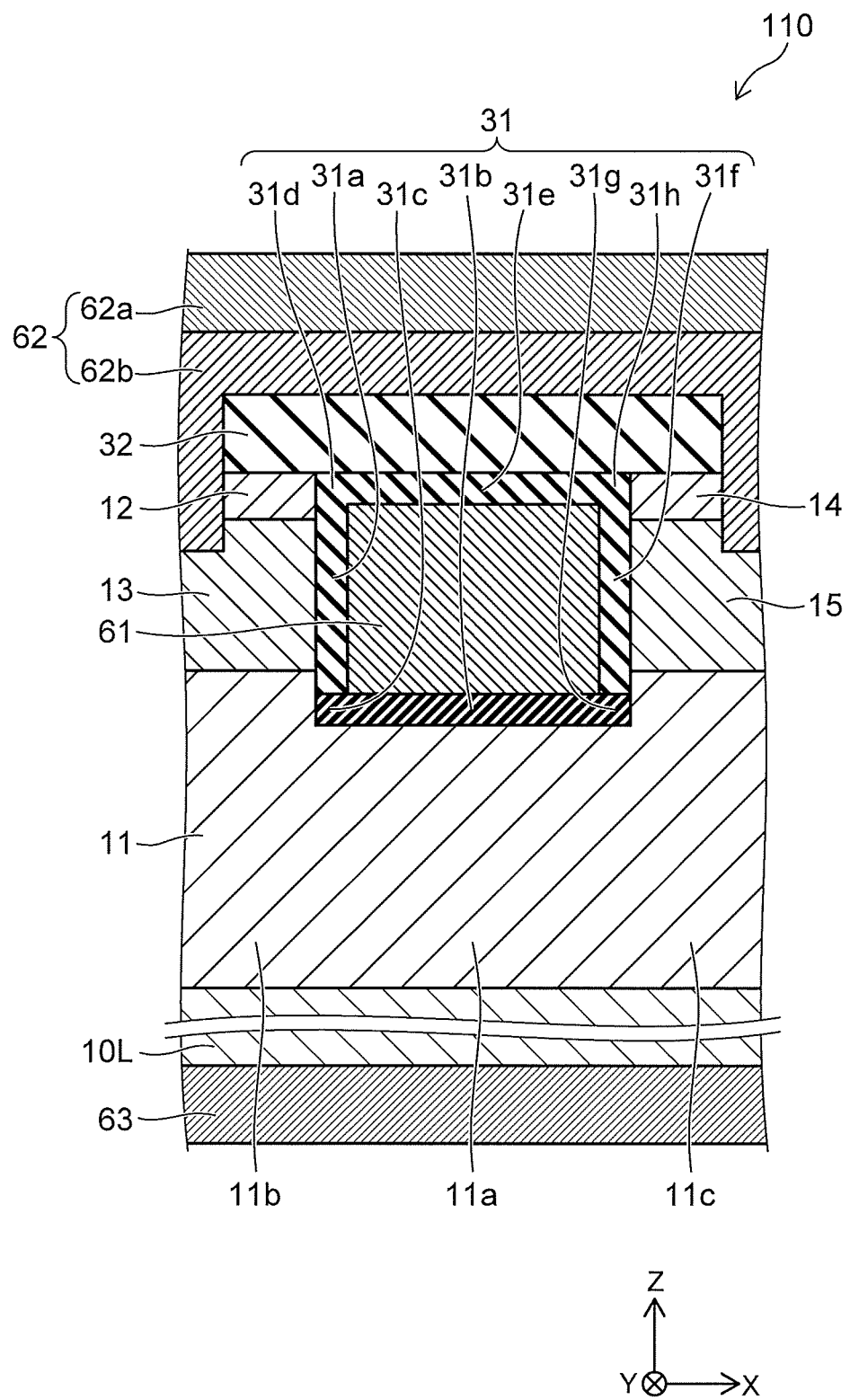
FIG. 1 is a schematic cross-sectional view illustrating a semiconductor device according to a first embodiment.

According to one embodiment, a semiconductor device includes a first semiconductor region, a second semiconductor region, a third semiconductor region, a first electrode, a second electrode, a third electrode, and a first insulating portion. The first semiconductor region includes a first partial region and a second partial region and is of a first conductivity type. The second semiconductor region is of the first conductivity type. A first direction from the second partial region toward the second semiconductor region crosses a second direction from the second partial region toward the first partial region. The third semiconductor region is provided between the second partial region and the second semiconductor region in the first direction. The third semiconductor region is of a second conductivity type. A direction from the third semiconductor region toward the first electrode is aligned with the second direction. The second electrode is electrically connected to the second semiconductor region. The third electrode is electrically connected to the first semiconductor region. The first insulating portion includes a first insulating region provided between the third semiconductor region and the first electrode in the second direction, a second insulating region provided between the first partial region and the first electrode in the first direction, and a third insulating region provided between the first partial region and the first insulating region in the first direction. The first insulating region and the third insulating region satisfy at least one of first to fifth conditions. In the first condition, the third insulating region includes nitrogen, and the first insulating region does not include nitrogen. In the second condition, the first insulating region and the third insulating region include nitrogen, and a concentration of nitrogen in the first insulating region is lower than a concentration of nitrogen in the third insulating region. In the third condition, the third insulating region includes a first metal. The first insulating region does not include the first metal, and the first metal is at least one selected from the group consisting of Al, Ti, Mg, Zr, Ta, Ce, Ir, Ru, Re, and Sr. In the fourth condition, the first insulating region and the third insulating region include the first metal, and a concentration of the first metal in the first insulating region is lower than a concentration of the first metal in the third insulating region. In the fifth condition, the first insulating region includes $SiO_{z1}$, and the third insulating region includes $SiO_{z2}$ ($z1<z2$).

According to another embodiment, a semiconductor device includes a first semiconductor region, a second semiconductor region, a third semiconductor region, a first electrode, a second electrode, a third electrode, and a first insulating portion. The first semiconductor region includes a first partial region and a second partial region and is of a first conductivity type. The second semiconductor region is of the first conductivity type. A first direction from the second partial region toward the second semiconductor region crosses a second direction from the second partial region toward the first partial region. The third semiconductor region is provided between the second partial region and the second semiconductor region in the first direction. The third semiconductor region is of a second conductivity type. A direction from the third semiconductor region toward the first electrode is aligned with the second direction. The second electrode is electrically connected to the second semiconductor region. The third electrode is electrically connected to the first semiconductor region. The first insulating portion includes a first insulating region provided between the third semiconductor region and the first electrode in the second direction, a second insulating region provided between the first partial region and the first electrode in the first direction, a third insulating region provided between the first partial region and the first insulating region in the first direction, and a fourth insulating region. The first insulating region is positioned between the third insulating region and the fourth insulating region in the first direction. The first insulating region and the fourth insulating region satisfy at least one of sixth to tenth conditions. In the sixth condition, the fourth insulating region includes nitrogen, and the first insulating region does not include nitrogen. In the seventh condition, the first insulating region and the fourth insulating region include nitrogen, and a concentration of nitrogen in the first insulating region is lower than a concentration of nitrogen in the fourth insulating region. In the eighth condition, the fourth insulating region includes a second metal, the first insulating region does not include the second metal, and the second metal is at least one selected from the group consisting of Al, Ti, Mg, Zr, Ta, Ce, Ir, Ru, Re, and Sr. In the ninth condition, the first insulating region and the fourth insulating region include the second metal, and a concentration of the second metal in the first insulating region is lower than a concentration of the second metal in the fourth insulating region. In the tenth condition, the first insulating region includes $SiO_{z1}$, and the fourth insulating region includes $SiO_{z2}$ (z1<z2).

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes first to third semiconductor regions 11 to 13, first to third electrodes 61 to 63, and a first insulating portion 31. The first to third semiconductor regions 11 to 13 include, for example, silicon.

The first semiconductor region 11 and the second semiconductor region 12 are of a first conductivity type. The third semiconductor region 13 is of a second conductivity type.

For example, the first conductivity type is an n-type; and the second conductivity type is a p-type. The first conductivity type may be the p-type; and the second conductivity type may be the n-type. In the following examples, the first conductivity type is the n-type; and the second conductivity type is the p-type.

An n-type impurity includes, for example, at least one selected from the group consisting of P and As. A p-type impurity includes, for example, at least one selected from the group consisting of B and Al.

The first semiconductor region 11 includes a first partial region 11a and a second partial region 11b. The first partial region 11a is separated from the first electrode 61 in a first direction. The first partial region 11a is positioned between the first electrode 61 and the third electrode 63 in the first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

The direction from the second partial region 11b toward the first partial region 11a is aligned with a second direction. The second direction crosses the first direction (the Z-axis direction). The second direction is, for example, the X-axis direction.

The second semiconductor region 12 is separated from the second partial region 11b in the first direction (the Z-axis direction).

The third semiconductor region 13 is provided between the second partial region 11b and the second semiconductor region 12 in the first direction (the Z-axis direction).

The direction from the third semiconductor region 13 toward the first electrode 61 is aligned with the second direction (the X-axis direction).

The second electrode 62 is electrically connected to the second semiconductor region 12. For example, the second electrode 62 is provided above the first electrode 61. For example, the second semiconductor region 12 is positioned between the third semiconductor region 13 and at least a portion of the second electrode 62 in the first direction (the Z-axis direction).

In the example, the second electrode 62 includes a first conductive region 62a and a second conductive region 62b. A portion of the second conductive region 62b is positioned between the first electrode 61 and the first conductive region 62a in the first direction (the Z-axis direction). Another portion of the second conductive region 62b is positioned between the third semiconductor region 13 and the first conductive region 62a in the first direction (the Z-axis direction). A portion of the second semiconductor region 12 and a portion of the third semiconductor region 13 are positioned between the second conductive region 62b and the first electrode 61 in the second direction (the X-axis direction).

The third electrode 63 is electrically connected to the first semiconductor region 11. For example, the third electrode 63 is provided below the first semiconductor region 11. For example, the first partial region 11a is positioned between the third electrode 63 and the first electrode 61 in the first direction (the Z-axis direction). For example, the second partial region 11b is positioned between the third electrode 63 and the third semiconductor region 13 in the first direction (the Z-axis direction).

The first insulating portion 31 includes first to fifth insulating regions 31a to 31e. The first insulating region 31a is provided between the third semiconductor region 13 and the first electrode 61 in the second direction (the X-axis direction). The first insulating region 31a is provided between the third insulating region 31c and the fourth insulating region 31d in the first direction (the Z-axis direction). The second insulating region 31b is provided between the first partial region 11a and the first electrode 61 in the first direction (the Z-axis direction). The third insulating region 31c is provided between the first partial region 11a and the first insulating region 31a in the first direction (the Z-axis direction). In the example, the third insulating region 31c is provided between the second partial region 11b and the second insulating region 31b in the second direction (the X-axis direction). The third insulating region 31c may be provided between the second insulating region 31b and the first insulating region 31a in the first direction (the Z-axis direction). The fourth insulating region 31d is provided between the first insulating region 31a and the second electrode 62 in the first direction (the Z-axis direction). In the example, the fourth insulating region 31d is provided between the second semiconductor region 12 and the fifth insulating region 31e in the second direction (the X-axis direction). The fourth insulating region 31d may be provided between the first insulating region 31a and the fifth insulating region 31e in the first direction (the Z-axis direction). The fifth insulating region 31e is provided between the first electrode 61 and the second electrode 62 in the first direction (the Z-axis direction).

For example, the first partial region 11a is positioned on the third electrode 63. The second insulating region 31b and the third insulating region 31c are positioned on the first partial region 11a. The first electrode 61 is positioned on the second insulating region 31b. The first insulating region 31a is positioned on the third insulating region 31c. The fourth insulating region 31d is positioned on the first insulating region 31a. The fifth insulating region 31e is positioned on the first electrode 61. The second electrode 62 is positioned on the fourth insulating region 31d and the fifth insulating region 31e. The second partial region 11b is positioned at the side of the first partial region 11a. The third semiconductor region 13 is positioned on the second partial region 11b. The second semiconductor region 12 is positioned on the third semiconductor region 13. The second electrode 62 is positioned on the second semiconductor region 12.

In the example, the semiconductor device 110 further includes a second insulating portion 32. In the first direction (the Z-axis direction), a portion of the second insulating portion 32 is provided between the fourth insulating region 31d and the second electrode 62 and between the fifth insulating region 31e and the second electrode 62. Another portion of the second insulating portion 32 is provided between the second semiconductor region 12 and the second electrode 62 in the first direction (the Z-axis direction).

The semiconductor device 110 is, for example, a transistor. For example, the first electrode 61 functions as a gate electrode. For example, the second electrode 62 functions as a source electrode. For example, the second conductive region 62b of the second electrode 62 functions as a barrier metal. For example, the third electrode 63 functions as a drain electrode. For example, the first to fourth insulating regions 31a to 31d and sixth to eighth insulating regions 31f to 31h of the first insulating portion 31 function as gate insulating films. For example, the second insulating portion 32 and the fifth insulating region 31e of the first insulating portion 31 function as inter-layer insulating films.

For example, the first semiconductor region 11 functions as a drift region. For example, a region that includes the second semiconductor region 12 and the third semiconductor region 13 functions as a channel region. The second semiconductor region 12 functions as a contact region for the second electrode 62. The semiconductor device 110 is, for example, a trench transistor.

In the example, the semiconductor device 110 further includes a semiconductor layer 10L. The semiconductor layer 10L is positioned between the third electrode 63 and the first semiconductor region 11 in the first direction (the Z-axis direction). The semiconductor layer 10L is of the first conductivity type or the second conductivity type. In the case where the semiconductor layer 10L is of the first conductivity type, the semiconductor device 110 functions as a MOS transistor. In the case where the semiconductor layer 10L is of the second conductivity type, the semiconductor device 110 functions as an IGBT (Insulated Gate Bipolar Transistor).

The first electrode 61 overlaps the first semiconductor region 11 in the second direction (the X-axis direction). For example, a portion of the first insulating region 31a of the first insulating portion 31 is positioned between the second partial region 11b and the first electrode 61 in the second direction (the X-axis direction). For example, the lower end of the first electrode 61 is positioned lower than the lower end of the third semiconductor region 13.

The first electrode 61 overlaps the second semiconductor region 12 in the second direction (the X-axis direction). For example, another portion of the first insulating region 31a of the first insulating portion 31 is positioned between the second semiconductor region 12 and the first electrode 61 in the second direction (the X-axis direction). For example, the upper end of the first electrode 61 is positioned higher than the upper end of the third semiconductor region 13.

In the embodiment, the first insulating region 31a and the third insulating region 31c satisfy at least one of first to fifth conditions. In the first condition, the third insulating region 31c includes nitrogen; and the first insulating region 31a does not include nitrogen. In the second condition, the first insulating region 31a and the third insulating region 31c include nitrogen; and the concentration of nitrogen in the first insulating region 31a is lower than the concentration of nitrogen in the third insulating region 31c. In the third condition, the third insulating region 31c includes a first metal; the first insulating region 31a does not include the first metal; and the first metal is at least one selected from the group consisting of Al, Ti, Mg, Zr, Ta, Ce, Ir, Ru, Re, and Sr. In the fourth condition, the first insulating region 31a and the third insulating region 31c include the first metal; and the concentration of the first metal in the first insulating region 31a is lower than the concentration of the first metal in the third insulating region 31c. In the fifth condition, the first insulating region 31a includes $SiO_{z1}$; and the third insulating region 31c includes $SiO_{z2}$ ($z1<z2$).

When a negative voltage is applied to the first electrode 61 (e.g., the gate electrode) for a long period of time, the threshold voltage may shift to the negative side. For example, when the negative voltage is applied, Si—H bonds are broken by holes induced at the interface between the second semiconductor region 12 (e.g., the substrate) and the first insulating region 31a (e.g., the gate insulating film); and traps of positive charge are generated at the interface. It is considered that the shift of the threshold voltage occurs thereby. When the hydrogen freed by the breaking of the Si—H bonds diffuses, the hydrogen concentration in the first insulating region 31a (the interface vicinity) decreases; and the breaking of the Si—H bonds recited above occurs easily.

In the embodiment, the third insulating region 31c that satisfies at least one of the first to fifth conditions can suppress the diffusion of hydrogen better than the first insulating region 31a. By providing the third insulating region 31c, the characteristics of the semiconductor device can be more stable than in the case where the third insulating region 31c is not provided. For example, the shift of the threshold voltage to the negative side is suppressed. The first insulating region 31a also may be able to suppress the diffusion of hydrogen.

In the embodiment, the third insulating region 31c may include a first compound which is at least one selected from the group consisting of $Si_3N_4$, AlN, WN, $Al_xO_y$, $TiO_x$, $MgO_x$, $ZrO_x$, $Ta_5O_3$, $CeO_2$, $IrO_x$, $RuO_x$, $ReO_x$, $Al_xSi_yO_z$, $MgTiO_x$, and $SrRuO_3$. For example, $Al_xO_y$ includes $Al_2O_3$. For example, $TiO_x$ includes $TiO_2$. For example, $ZrO_x$ includes $ZrO_2$. For example, the first insulating region 31a does not include the first compound. For example, the first insulating region 31a may include the first compound. In such a case, the concentration of the first compound in the first insulating region 31a is lower than the concentration of the first compound in the third insulating region 31c.

In the case where at least one of the first to fifth conditions recited above is satisfied, the diffusion coefficient of hydrogen in the third insulating region 31c is lower than the diffusion coefficient of hydrogen in the first insulating region 31a. The diffusion coefficient of hydrogen in the third insulating region 31c is, for example, $1\times10^{-13}$ cm$^2$/s or less.

As shown in FIG. 1, the semiconductor device 110 may further include a fourth semiconductor region 14 and a fifth semiconductor region 15. The first semiconductor region 11 may further include a third partial region 11c. The first insulating portion 31 may further include the sixth to eighth insulating regions 31f to 31h.

The fourth semiconductor region 14 is of the first conductivity type. A portion of the first electrode 61 is positioned between the second semiconductor region 12 and the fourth semiconductor region 14 in the second direction (the X-axis direction).

The fifth semiconductor region 15 is of the second conductivity type. The first electrode 61 is positioned between the third semiconductor region 13 and the fifth semiconductor region 15 in the second direction (the X-axis direction). The fifth semiconductor region 15 is positioned between the third partial region 11c and the fourth semiconductor region 14 in the first direction (the Z-axis direction).

The sixth insulating region 31f is provided between the first electrode 61 and the fifth semiconductor region 15 in the second direction (the X-axis direction). The sixth insulating region 31f is provided between the seventh insulating region 31g and the eighth insulating region 31h in the first direction (the Z-axis direction). The seventh insulating region 31g is provided between the first partial region 11a and the sixth insulating region 31f in the first direction (the Z-axis direction). In the example, the seventh insulating region 31g is provided between the second insulating region 31b and the third partial region 11c in the second direction (the X-axis direction). The seventh insulating region 31g may be provided between the second insulating region 31b and the sixth insulating region 31f in the first direction (the Z-axis direction). The eighth insulating region 31h is provided between the sixth insulating region 31f and the second electrode 62 in the first direction (the Z-axis direction). In the example, the eighth insulating region 31h is provided between the fifth insulating region 31e and the fourth semiconductor region 14 in the second direction (the X-axis direction). The eighth insulating region 31h may be provided between the sixth insulating region 31f and the fifth insulating region 31e in the first direction (the Z-axis direction).

In the embodiment, for example, the sixth insulating region 31f and the seventh insulating region 31g satisfy at least one of eleventh to fifteenth conditions. In the eleventh condition, the seventh insulating region 31g includes nitrogen; and the sixth insulating region 31f does not include nitrogen. In the twelfth condition, the sixth insulating region 31f and the seventh insulating region 31g include nitrogen; and the concentration of nitrogen in the sixth insulating region 31f is lower than the concentration of nitrogen in the seventh insulating region 31g. In the thirteenth condition, the seventh insulating region 31g includes the first metal; and the sixth insulating region 31f does not include the first metal. In the fourteenth condition, the sixth insulating region 31f and the seventh insulating region 31g include the first metal; and the concentration of the first metal in the sixth insulating region 31f is lower than the concentration of the first metal in the seventh insulating region 31g. In the fifteenth condition, the sixth insulating region 31f includes $SiO_{z1}$; and the seventh insulating region 31g includes $SiO_{z2}$ (z1<z2).

In the embodiment, the composition of the sixth insulating region 31f may be substantially the same as the composition of the first insulating region 31a. The concentration of nitrogen in the sixth insulating region 31f may be substantially the same as the concentration of nitrogen in the first insulating region 31a. The concentration of the first metal in the sixth insulating region 31f may be substantially the same as the concentration of the first metal in the first insulating region 31a.

In the embodiment, the composition of the seventh insulating region 31g may be substantially the same as the composition of the third insulating region 31c. The concentration of nitrogen in the seventh insulating region 31g may be substantially the same as the concentration of nitrogen in the third insulating region 31c. The concentration of the first metal in the seventh insulating region 31g may be substantially the same as the concentration of the first metal in the third insulating region 31c.

In the embodiment, for example, the first insulating region 31a and the second insulating region 31b satisfy at least one of twenty-first to twenty-fifth conditions. In the twenty-first condition, the second insulating region 31b includes nitrogen; and the first insulating region 31a does not include nitrogen. In the twenty-second condition, the first insulating region 31a and the second insulating region 31b include nitrogen; and the concentration of nitrogen in the first insulating region 31a is lower than the concentration of nitrogen in the second insulating region 31b. In the twenty-third condition, the second insulating region 31b includes the first metal; and the first insulating region 31a does not include the first metal. In the twenty-fourth condition, the first insulating region 31a and the second insulating region 31b include the first metal; and the concentration of the first metal in the first insulating region 31a is lower than the concentration of the first metal in the second insulating region 31b. In the twenty-fifth condition, the first insulating region 31a includes $SiO_{z1}$; and the second insulating region 31b includes $SiO_{z2}$ (z1<z2).

The twenty-first to twenty-fifth conditions correspond to the first to fifth conditions. The combination of the conditions satisfied by the first insulating region 31a and the third insulating region 31c and the conditions satisfied by the first insulating region 31a and the second insulating region 31b is not particularly limited. For example, the first insulating region 31a and the third insulating region 31c may satisfy the first condition; and the first insulating region 31a and the second insulating region 31b may satisfy the twenty-third condition. On the other hand, the first insulating portion 31 is easy to form when corresponding conditions are satisfied such as in the case where the first insulating region 31a and the third insulating region 31c satisfy the first condition and the first insulating region 31a and the second insulating region 31b satisfy the twenty-first condition, etc.

In the embodiment, the composition of the second insulating region 31b may be substantially the same as at least one of the composition of the third insulating region 31c or the composition of the seventh insulating region 31g. The concentration of nitrogen in the second insulating region 31b may be substantially the same as at least one of the concentration of nitrogen in the third insulating region 31c or the concentration of nitrogen in the seventh insulating region 31g. For example, the concentration of nitrogen in the second insulating region 31b is higher than at least one of the concentration of nitrogen in the first insulating region 31a or the concentration of nitrogen in the sixth insulating region 31f. The concentration of the first metal in the second insulating region 31b may be substantially the same as the concentration of the first metal in the third insulating region 31c and the concentration of the first metal in the seventh insulating region 31g. For example, the concentration of the first metal in the second insulating region 31b is higher than at least one of the concentration of the first metal in the first insulating region 31a or the concentration of the first metal in the sixth insulating region 31f. The second insulating region 31b may include $SiO_{z2}$.

In the embodiment, the first electrode 61 includes, for example, polysilicon. At least one of the second electrode 62 or the third electrode 63 includes a metal such as aluminum, etc. At least one of the first insulating portion 31 or the second insulating portion 32 includes a metal compound (silicon oxide, aluminum oxide, etc.). In the embodiment, the description recited above is an example; and various modifications of the materials are possible.

Figure 2:
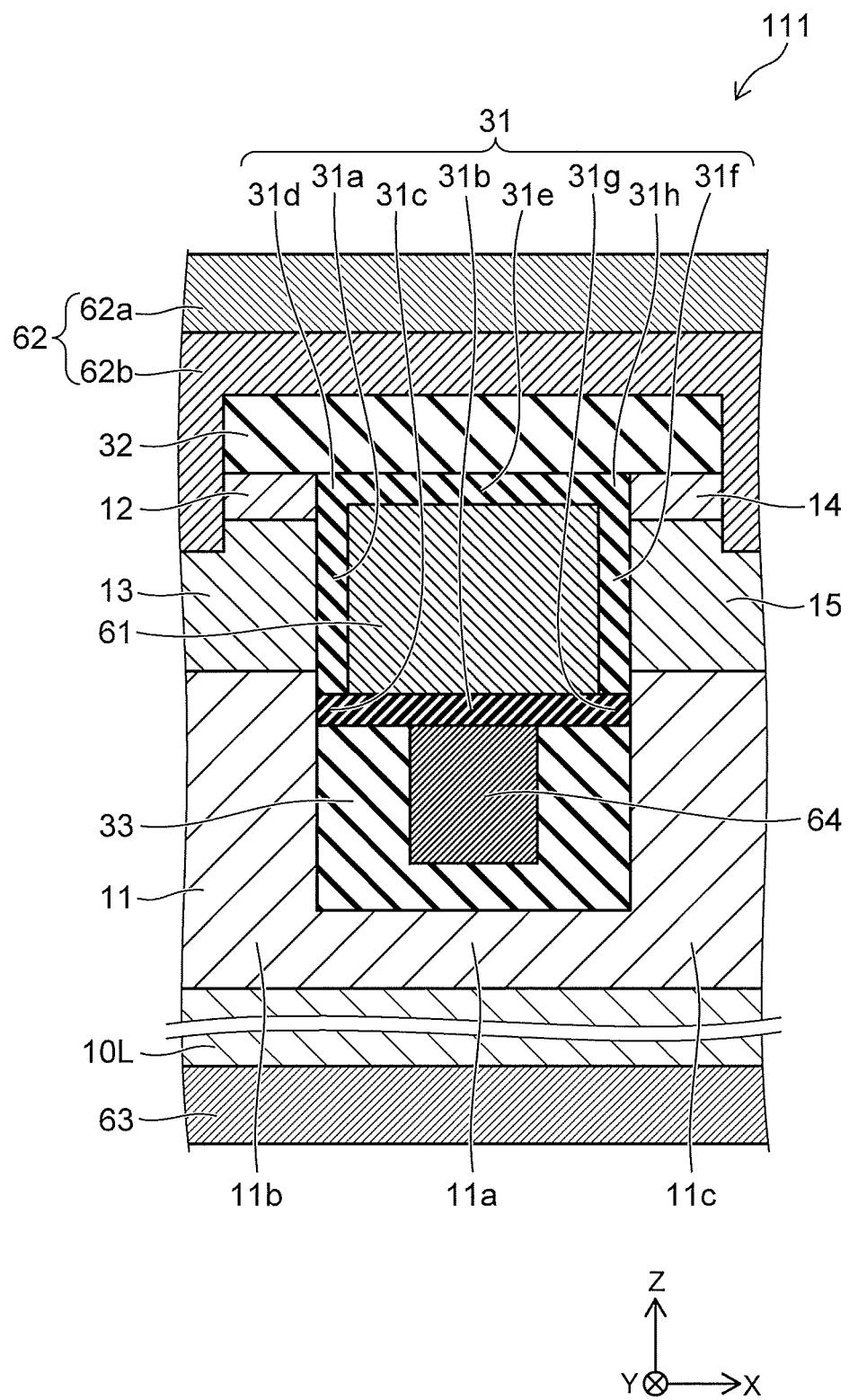
FIG. 2 is a schematic cross-sectional view illustrating another semiconductor device according to the first embodiment.

FIG. 2 is a schematic cross-sectional view illustrating another semiconductor device according to the first embodiment.

As shown in FIG. 2, the semiconductor device 111 further includes a third insulating portion 33 and a fourth electrode 64. In the first direction (the Z-axis direction), the third insulating portion 33 is provided between the first partial region 11a and the second insulating region 31b and between the first partial region 11a and the third insulating region 31c. The fourth electrode 64 is provided between the second insulating region 31b and the third insulating portion 33 in the first direction (the Z-axis direction). A portion of the third insulating portion 33 is positioned between the second partial region 11b and the fourth electrode 64 in the second direction (the X-axis direction). Otherwise, the semiconductor device 111 is similar to the semiconductor device 110 shown in FIG. 1. For example, the fourth electrode 64 functions as a second source electrode. In such a case, for example, the fourth electrode 64 is electrically connected to the second electrode 62. For example, the third insulating portion 33 functions as an inter-layer insulating film.

An example of a method for manufacturing the semiconductor device 111 will now be described.

FIG. 3A to FIG. 3D are schematic cross-sectional views illustrating the method for manufacturing the other semiconductor device according to the first embodiment.

Figure 3A:
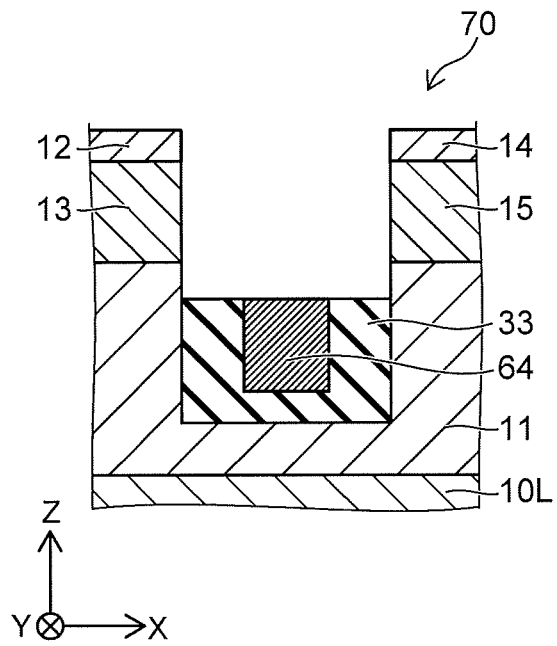
FIG. 3A to FIG. 3D are schematic cross-sectional views illustrating the method for manufacturing the other semiconductor device according to the first embodiment.

A base material 70 is prepared as shown in FIG. 3A. The base material 70 includes the first to fifth semiconductor regions 11 to 15, the semiconductor layer 10L, the third insulating portion 33, and the fourth electrode 64. For example, the first semiconductor region 11 is provided on the semiconductor layer 10L. The third semiconductor region 13 and the fifth semiconductor region 15 are provided on the first semiconductor region 11. The second semiconductor region 12 is provided on the third semiconductor region 13. The fourth semiconductor region 14 is provided on the fifth semiconductor region 15. The third insulating portion 33 is provided inside a recess provided in the first semiconductor region 11. The fourth electrode 64 is provided inside a recess provided in the third insulating portion 33.

Figure 3B:
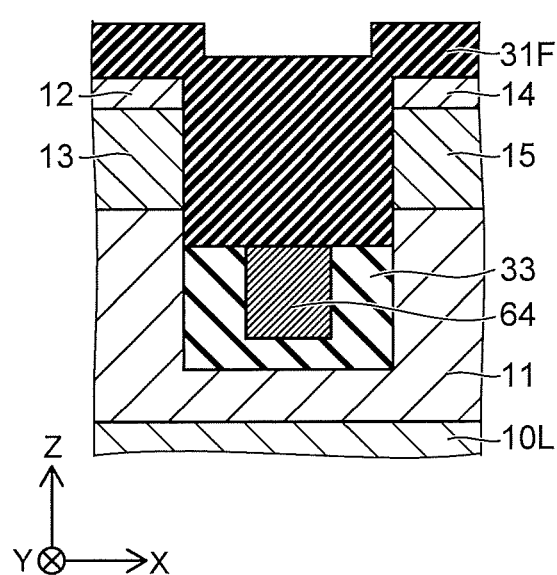

A first insulating film 31F is formed as shown in FIG. 3B. The first insulating film 31F is formed on the upper surface of the third insulating portion 33 and the upper surface of the fourth electrode 64. The first insulating film 31F may be formed on the side surface of the first to fifth semiconductor regions 11 to 15, the upper surface of the second semiconductor region 12, and the upper surface of the fourth semiconductor region 14. The first insulating film 31F includes, for example, $Si_3N_4$.

Figure 3C:
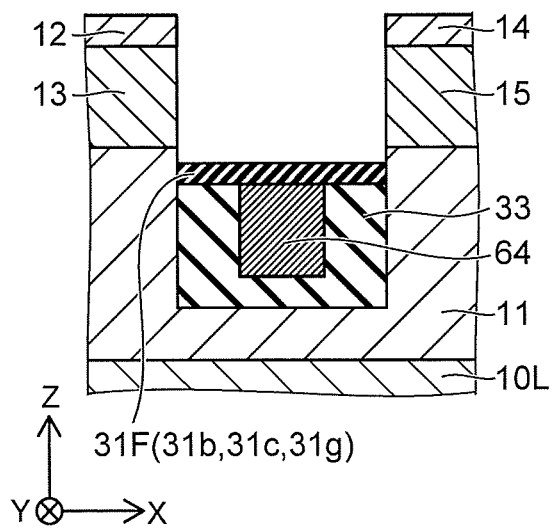

As shown in FIG. 3C, the thickness of the portion of the first insulating film 31F provided on the upper surface of the third insulating portion 33 and the upper surface of the fourth electrode 64 is reduced. For example, the thickness is reduced by dry etching, etc. The thickness of the portion of the first insulating film 31F provided on the side surface of the first to fifth semiconductor regions 11 to 15, the upper surface of the second semiconductor region 12, and the upper surface of the fourth semiconductor region 14 may be reduced. The portion of the first insulating film 31F provided on the upper surface of the third insulating portion 33 and the upper surface of the fourth electrode 64 remains. The remaining first insulating film 31F becomes the second insulating region 31b, the third insulating region 31c, and the seventh insulating region 31g of the first insulating portion 31.

Figure 3D:
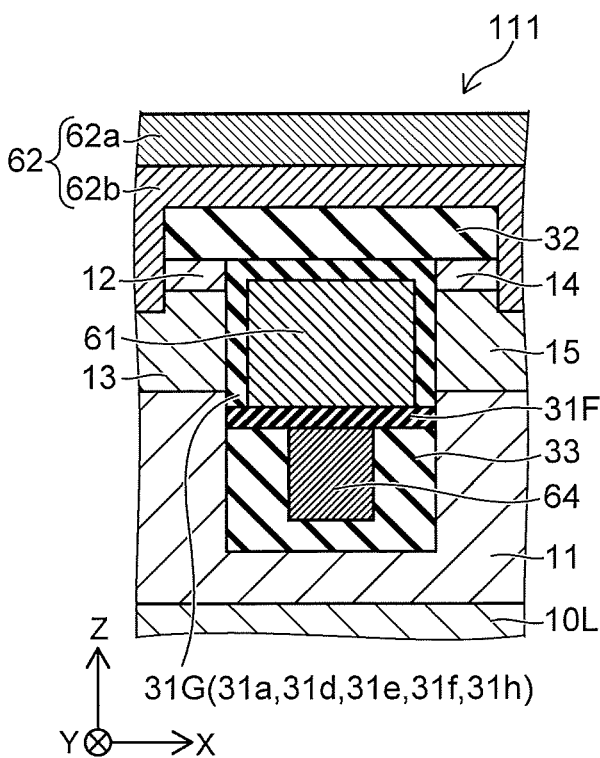

As shown in FIG. 3D, the first electrode 61 is provided on the first insulating film 31F. A second insulating film 31G is formed between the first electrode 61 and the side surfaces of the first to fifth semiconductor regions 11 to 15 and on the upper surface of the first electrode 61. The second insulating film 31G becomes the first insulating region 31a, the fourth insulating region 31d, the fifth insulating region 31e, the sixth insulating region 31f, and the eighth insulating region 31h of the first insulating portion 31. The second insulating film 31G includes, for example, silicon oxide, etc. For example, the second insulating film 31G substantially does not include $Si_3N_4$. Also, the second insulating portion 32 is formed on the upper surface of the second insulating film 31G, the upper surface of the second semiconductor region 12, and the upper surface of the fourth semiconductor region 14. The formation of the second insulating film 31G and the formation of the second insulating portion 32 may be performed continuously. A portion of the second insulating portion 32 and a portion of the second to fifth semiconductor regions 12 to 15 are removed. For example, the removal is performed by dry etching, etc. The second conductive region 62b is formed on a portion of the upper surface and a portion of the side surface of the third semiconductor region 13, a portion of the upper surface and a portion of the side surface of the fifth semiconductor region 15, the side surface of the second semiconductor region 12, the side surface of the fourth semiconductor region 14, and the upper surface and the side surface of the second insulating portion 32. The first conductive region 62a is formed on the upper surface of the second conductive region 62b. The first conductive region 62a and the second conductive region 62b become the second electrode 62. The semiconductor device 111 is obtained thereby.

In the example recited above, the first insulating region 31a and the third insulating region 31c that satisfy the first condition are provided. The first insulating region 31a and the third insulating region 31c that satisfy the second to fifth conditions can be provided by changing the composition of the first insulating film 31F and the second insulating film 31G. In the example recited above, the sixth insulating region 31f and the seventh insulating region 31g that satisfy the eleventh condition are provided. The sixth insulating region 31f and the seventh insulating region 31g that satisfy the twelfth to fifteenth conditions can be provided by changing the composition of the first insulating film 31F and the second insulating film 31G.

According to the manufacturing method recited above, a method for manufacturing a semiconductor device can be provided in which the characteristics can be stabilized.

For example, other than the third insulating portion 33 and the fourth electrode 64 not being provided in the base material 70, the semiconductor device 110 can be manufactured by a method similar to the method shown in FIG. 3A to FIG. 3D.

Second Embodiment

Figure 4:
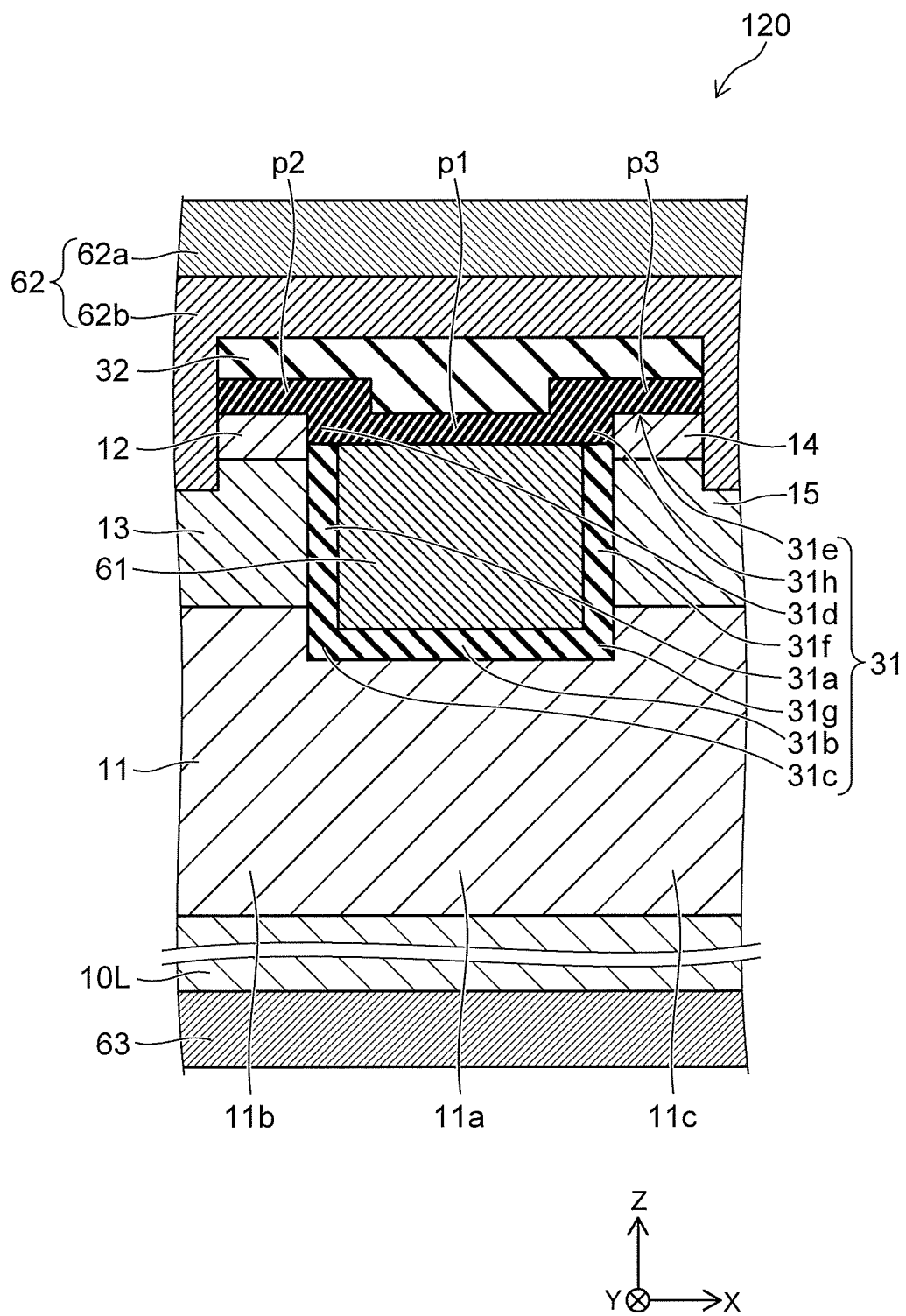
FIG. 4 is a schematic cross-sectional view illustrating a semiconductor device according to a second embodiment.

FIG. 4 is a schematic cross-sectional view illustrating a semiconductor device according to a second embodiment.

As shown in FIG. 4, the semiconductor device 120 includes the first to fifth semiconductor regions 11 to 15, the semiconductor layer 10L, the first to third electrodes 61 to 63, the first insulating portion 31, and the second insulating portion 32. The first insulating portion 31 includes the first to eighth insulating regions 31a to 31h.

In the embodiment, the fifth insulating region 31e of the first insulating portion 31 includes first to third portions p1 to p3. The first portion p1 is positioned between the first electrode 61 and the second electrode 62 in the first direction (the Z-axis direction). The first portion p1 is positioned between the second semiconductor region 12 and the fourth semiconductor region 14 in the second direction (the X-axis direction). In the example, the first portion p1 is positioned between the fourth insulating region 31d and the eighth insulating region 31h in the second direction (the X-axis direction). A portion of the second portion p2 is positioned between the second semiconductor region 12 and the second electrode 62 in the first direction (the Z-axis direction). Another portion of the second portion p2 is positioned between the fourth insulating region 31d and the second electrode 62 in the first direction (the Z-axis direction). A portion of the third portion p3 is positioned between the fourth semiconductor region 14 and the second electrode 62 in the first direction (the Z-axis direction). Another portion of the third portion p3 is positioned between the eighth insulating region 31h and the second electrode 62 in the first direction (the Z-axis direction). A portion of the second insulating portion 32 is positioned between the second portion p2 and the third portion p3 in the second direction (the X-axis direction).

In the embodiment, the first insulating region 31a and the fourth insulating region 31d satisfy at least one of sixth to tenth conditions. In the sixth condition, the fourth insulating region 31d includes nitrogen; and the first insulating region 31a does not include nitrogen. In the seventh condition, the first insulating region 31a and the fourth insulating region 31d include nitrogen; and the concentration of nitrogen in the first insulating region 31a is lower than the concentration of nitrogen in the fourth insulating region 31d. In the eighth condition, the fourth insulating region 31d includes a second metal; the first insulating region 31a does not include the second metal; and the second metal is at least one selected from the group consisting of Al, Ti, Mg, Zr, Ta, Ce, Ir, Ru, Re, and Sr. In the ninth condition, the first insulating region 31a and the fourth insulating region 31d include the second metal; and the concentration of the second metal in the first insulating region 31a is lower than the concentration of the second metal in the fourth insulating region 31d. In the tenth condition, the first insulating region 31a includes $SiO_{z1}$; and the fourth insulating region 31d includes $SiO_{z2}$ (z1<z2).

In the embodiment, the fourth insulating region 31d that satisfies at least one of the sixth to tenth conditions can suppress the diffusion of hydrogen better than the first insulating region 31a. By providing the fourth insulating region 31d, the characteristics of the semiconductor device can be more stable than in the case where the fourth insulating region 31d is not provided. For example, the shift of the threshold voltage to the negative side is suppressed. The first insulating region 31a also may be able to suppress the diffusion of hydrogen.

In the embodiment, the fourth insulating region 31d may include the first compound which is at least one selected from the group consisting of $Si_3N_4$, AlN, WN, $Al_xO_y$, $TiO_x$, $MgO_x$, $ZrO_x$, $Ta_5O_3$, $CeO_2$, $IrO_x$, $RuO_x$, $ReO_x$, $Al_xSi_yO_z$, $MgTiO_x$, and $SrRuO_3$. For example, $Al_xO_y$ includes $Al_2O_3$. For example, $TiO_x$ includes $TiO_2$. For example, $ZrO_x$ includes $ZrO_2$. For example, the first insulating region 31a does not include the first compound. For example, the first insulating region 31a may include the first compound. In such a case, the concentration of the first compound in the first insulating region 31a is lower than the concentration of the first compound in the fourth insulating region 31d.

In the case where at least one of the sixth to tenth conditions recited above is satisfied, the diffusion coefficient of hydrogen in the fourth insulating region 31d is lower than the diffusion coefficient of hydrogen in the first insulating region 31a. The diffusion coefficient of hydrogen in the fourth insulating region 31d is, for example, $1\times10^{-13}$ $cm^2/s$ or less.

In the embodiment, for example, the sixth insulating region 31f and the eighth insulating region 31h satisfy at least one of the sixteenth to twentieth conditions. In the sixteenth condition, the eighth insulating region 31h includes nitrogen; and the sixth insulating region 31f does not include nitrogen. In the seventeenth condition, the sixth insulating region 31f and the eighth insulating region 31h include nitrogen; and the concentration of nitrogen in the sixth insulating region 31f is lower than the concentration of nitrogen in the eighth insulating region 31h. In the eighteenth condition, the eighth insulating region 31h includes the second metal; and the sixth insulating region 31f does not include the second metal. In the nineteenth condition, the sixth insulating region 31f and the eighth insulating region 31h include the second metal; and the concentration of the second metal in the sixth insulating region 31f is lower than the concentration of the second metal in the eighth insulating region 31h. In the twentieth condition, the sixth insulating region 31f includes $SiO_{z1}$; and the eighth insulating region 31h includes $SiO_{z2}$ (z1<z2).

In the embodiment, the composition of the eighth insulating region 31h may be substantially the same as the composition of the fourth insulating region 31d. The concentration of nitrogen in the eighth insulating region 31h may be substantially the same as the concentration of nitrogen in the fourth insulating region 31d. The concentration of the second metal in the eighth insulating region 31h may be substantially the same as the concentration of the second metal in the fourth insulating region 31d.

For example, the first insulating region 31a and the fifth insulating region 31e satisfy at least one of twenty-sixth to thirtieth conditions. In the twenty-sixth condition, the fifth insulating region 31e includes nitrogen; and the first insulating region 31a does not include nitrogen. In the twenty-seventh condition, the first insulating region 31a and the fifth insulating region 31e include nitrogen; and the concentration of nitrogen in the first insulating region 31a is lower than the concentration of nitrogen in the fifth insulating region 31e. In the twenty-eighth condition, the fifth insulating region 31e includes the second metal; and the first insulating region 31a does not include the second metal. In the twenty-ninth condition, the first insulating region 31a and the fifth insulating region 31e include the second metal; and the concentration of the second metal in the first insulating region 31a is lower than the concentration of the second metal in the fifth insulating region 31e. In the thirtieth condition, the first insulating region 31a includes $SiO_{z1}$; and the fifth insulating region 31e includes $SiO_{z2}$ (z1<z2).

The twenty-sixth to thirtieth conditions correspond to the sixth to tenth conditions. The combination of the conditions satisfied by the first insulating region 31a and the fourth insulating region 31d and the conditions satisfied by the first insulating region 31a and the fifth insulating region 31e are not particularly limited. For example, the first insulating region 31a and the fourth insulating region 31d may satisfy the sixth condition; and the first insulating region 31a and the fifth insulating region 31e may satisfy the twenty-eighth condition. On the other hand, the first insulating portion 31 is easy to form when corresponding conditions are satisfied such as in the case where the first insulating region 31a and the fourth insulating region 31d satisfy the sixth condition and the first insulating region 31a and the fifth insulating region 31e satisfy the twenty-sixth condition, etc.

In the embodiment, the composition of the fifth insulating region 31e may be substantially the same as at least one of the composition of the fourth insulating region 31d or the composition of the eighth insulating region 31h. The concentration of nitrogen in the fifth insulating region 31e may be substantially the same as at least one of the concentration of nitrogen in the fourth insulating region 31d or the concentration of nitrogen in the eighth insulating region 31h. For example, the concentration of nitrogen in the fifth insulating region 31e is higher than at least one of the concentration of nitrogen in the first insulating region 31a or the concentration of nitrogen in the sixth insulating region 31f. The concentration of the second metal in the fifth insulating region 31e may be substantially the same as the concentration of the second metal in the fourth insulating region 31d and the concentration of the second metal in the eighth insulating region 31h. For example, the concentration of the second metal in the fifth insulating region 31e is higher than at least one of the concentration of the second metal in the first insulating region 31a or the concentration of the second metal in the sixth insulating region 31f. The fifth insulating region 31e may include $SiO_{z2}$.

Figure 5:
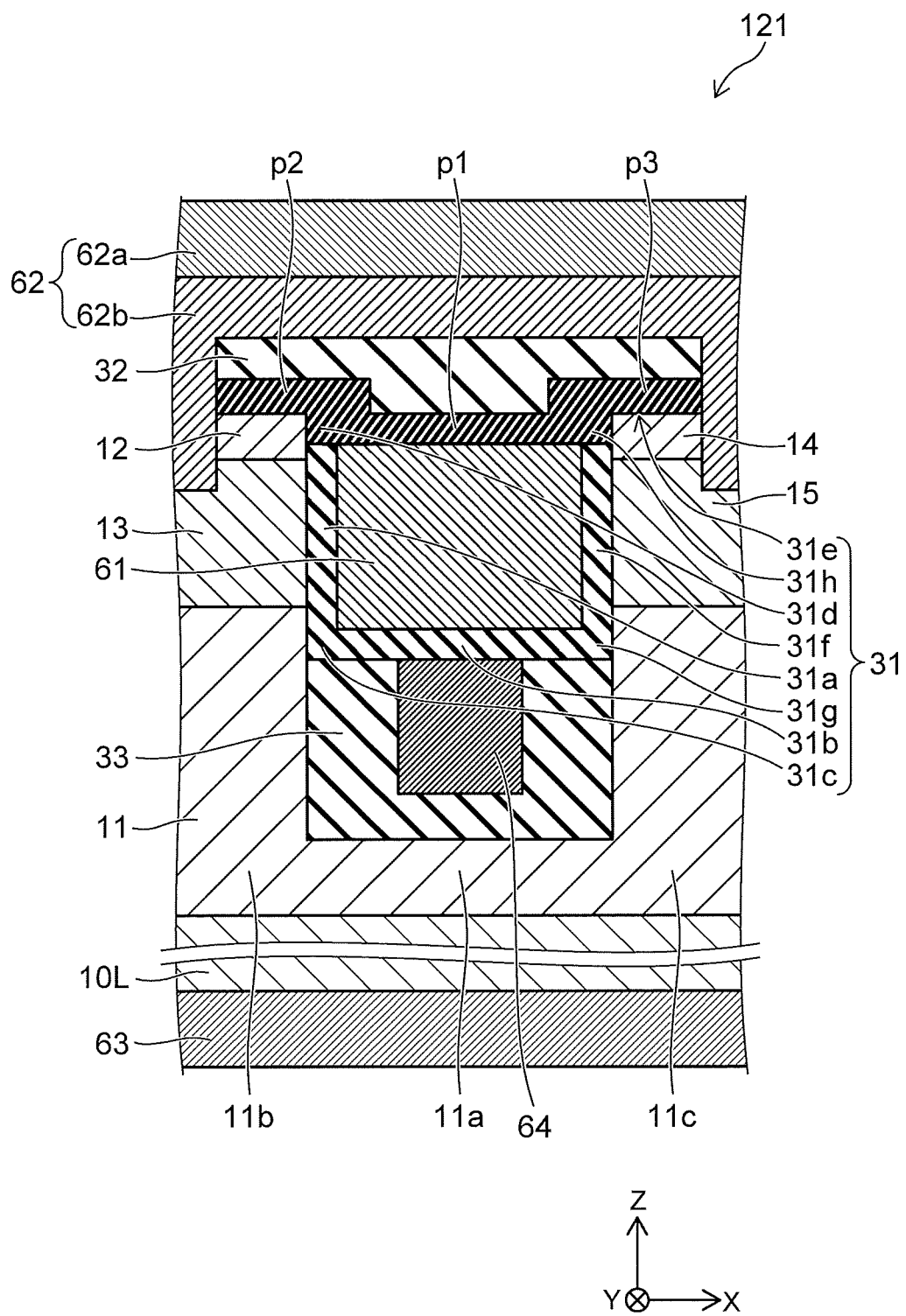
FIG. 5 is a schematic cross-sectional view illustrating another semiconductor device according to the second embodiment.

FIG. 5 is a schematic cross-sectional view illustrating another semiconductor device according to the second embodiment.

As shown in FIG. 5, the semiconductor device 121 further includes the third insulating portion 33 and the fourth electrode 64. In the first direction (the Z-axis direction), the third insulating portion 33 is provided between the first partial region 11a and the second insulating region 31b and between the first partial region 11a and the third insulating region 31c. The fourth electrode 64 is provided between the second insulating region 31b and the third insulating portion 33 in the first direction (the Z-axis direction). A portion of the third insulating portion 33 is positioned between the second partial region 11b and the fourth electrode 64 in the second direction (the X-axis direction). Otherwise, the semiconductor device 121 is similar to the semiconductor device 120 shown in FIG. 4. For example, the fourth electrode 64 functions as the second source electrode. In such a case, for example, the fourth electrode 64 is electrically connected to the second electrode 62. For example, the third insulating portion 33 functions as an inter-layer insulating film.

An example of a method for manufacturing the semiconductor device 121 will now be described.

FIG. 6A to FIG. 6D are schematic cross-sectional views illustrating the method for manufacturing the other semiconductor device according to the second embodiment.

Figure 6A:
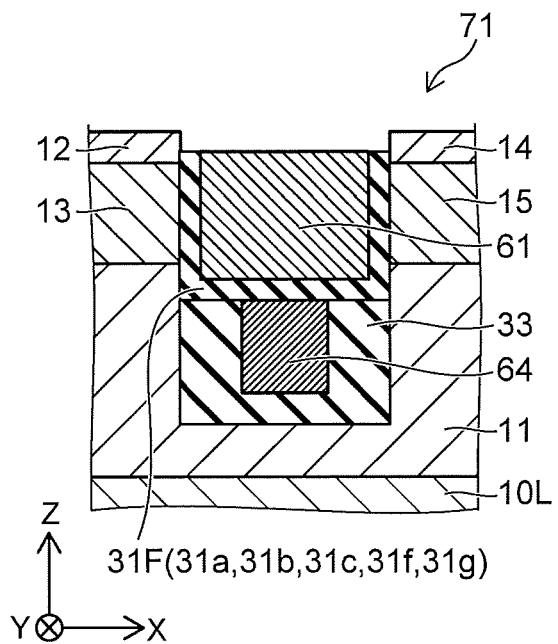
FIG. 6A to FIG. 6D are schematic cross-sectional views illustrating the method for manufacturing the other semiconductor device according to the second embodiment.

A base material 71 is prepared as shown in FIG. 6A. The base material 71 includes the first to fifth semiconductor regions 11 to 15, the semiconductor layer 10L, the third insulating portion 33, the fourth electrode 64, the first insulating film 31F, and the first electrode 61. For example, the first semiconductor region 11 is provided on the semiconductor layer 10L. The third semiconductor region 13 and the fifth semiconductor region 15 are provided on the first semiconductor region 11. The second semiconductor region 12 is provided on the third semiconductor region 13. The fourth semiconductor region 14 is provided on the fifth semiconductor region 15. The third insulating portion 33 is provided inside a recess provided in the first semiconductor region 11. The fourth electrode 64 is provided inside a recess provided in the third insulating portion 33. The first insulating film 31F is provided on the third insulating portion 33 and on the fourth electrode 64. The first electrode 61 is provided inside a recess provided in the first insulating film 31F. The first insulating film 31F includes, for example, silicon oxide, etc. For example, the first insulating film 31F substantially does not include $Si_3N_4$. The first insulating film 31F becomes the first insulating region 31a, the second insulating region 31b, the third insulating region 31c, the sixth insulating region 31f, and the seventh insulating region 31g of the first insulating portion 31.

Figure 6B:
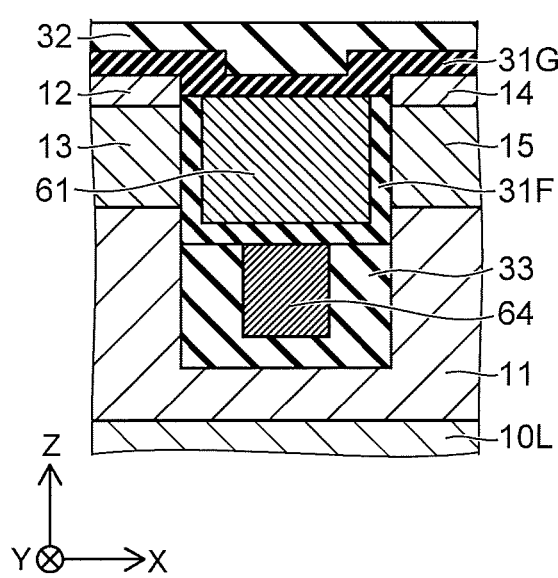

The second insulating film 31G is formed as shown in FIG. 6B. The second insulating film 31G is formed on the upper surface of the second semiconductor region 12, the upper surface of the fourth semiconductor region 14, the upper surface of the first electrode 61, and the upper surface of the first electrode 61. The second insulating film 31G includes, for example, $Si_3N_4$. Also, the second insulating portion 32 is formed on the upper surface of the second insulating film 31G.

Figure 6C:
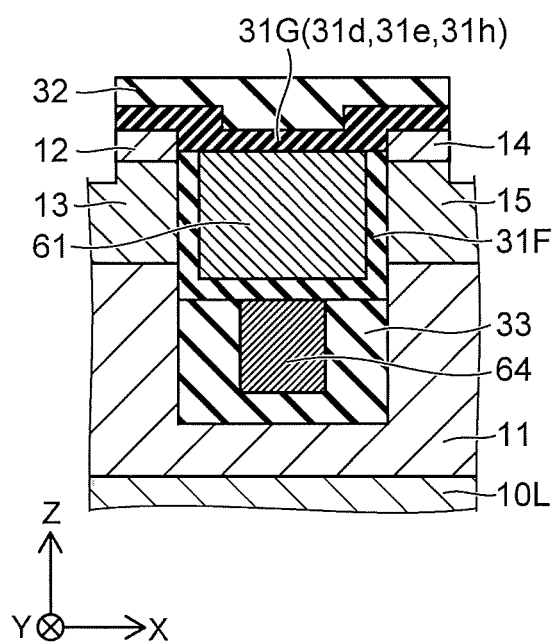

As shown in FIG. 6C, a portion of the second insulating portion 32, a portion of the second insulating film 31G, and a portion of the second to fifth semiconductor regions 12 to 15 are removed. For example, the removal is performed by dry etching, etc. The second insulating film 31G becomes the fourth insulating region 31d of the first insulating portion 31, the fifth insulating region 31e, and the eighth insulating region 31h.

Figure 6D:
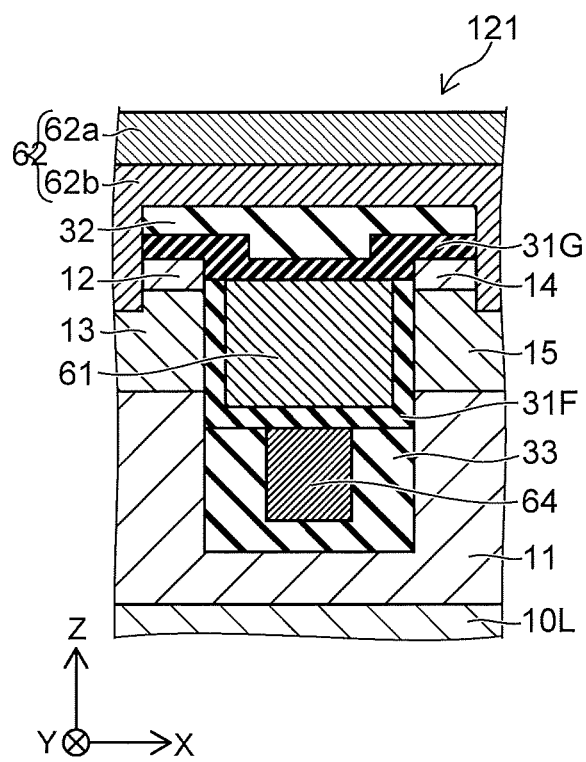

As shown in FIG. 6D, the second conductive region 62b is formed on a portion of the upper surface and a portion of the side surface of the third semiconductor region 13, a portion of the upper surface and a portion of the side surface of the fifth semiconductor region 15, the side surface of the second semiconductor region 12, the side surface of the fourth semiconductor region 14, the side surface of the second insulating film 31G, and the upper surface and the side surface of the second insulating portion 32. The first conductive region 62a is formed on the upper surface of the second conductive region 62b. The first conductive region 62a and the second conductive region 62b become the second electrode 62. The semiconductor device 121 is obtained thereby.

In the example recited above, the first insulating region 31a and the fourth insulating region 31d that satisfy the sixth condition are provided. The first insulating region 31a and the fourth insulating region 31d that satisfy the seventh to tenth conditions can be provided by changing the composition of the first insulating film 31F and the second insulating film 31G. In the example recited above, the sixth insulating region 31f and the eighth insulating region 31h that satisfy the sixteenth condition are provided. The sixth insulating region 31f and the eighth insulating region 31h that satisfy the seventeenth to twentieth conditions can be provided by changing the composition of the first insulating film 31F and the second insulating film 31G.

According to the manufacturing method recited above, a method for manufacturing a semiconductor device can be provided in which the characteristics can be stabilized.

For example, other than the third insulating portion 33 and the fourth electrode 64 not being provided in the base material 71, the semiconductor device 120 can be manufactured by a method similar to the method shown in FIG. 6A to FIG. 6D.

Third Embodiment

Figure 7:
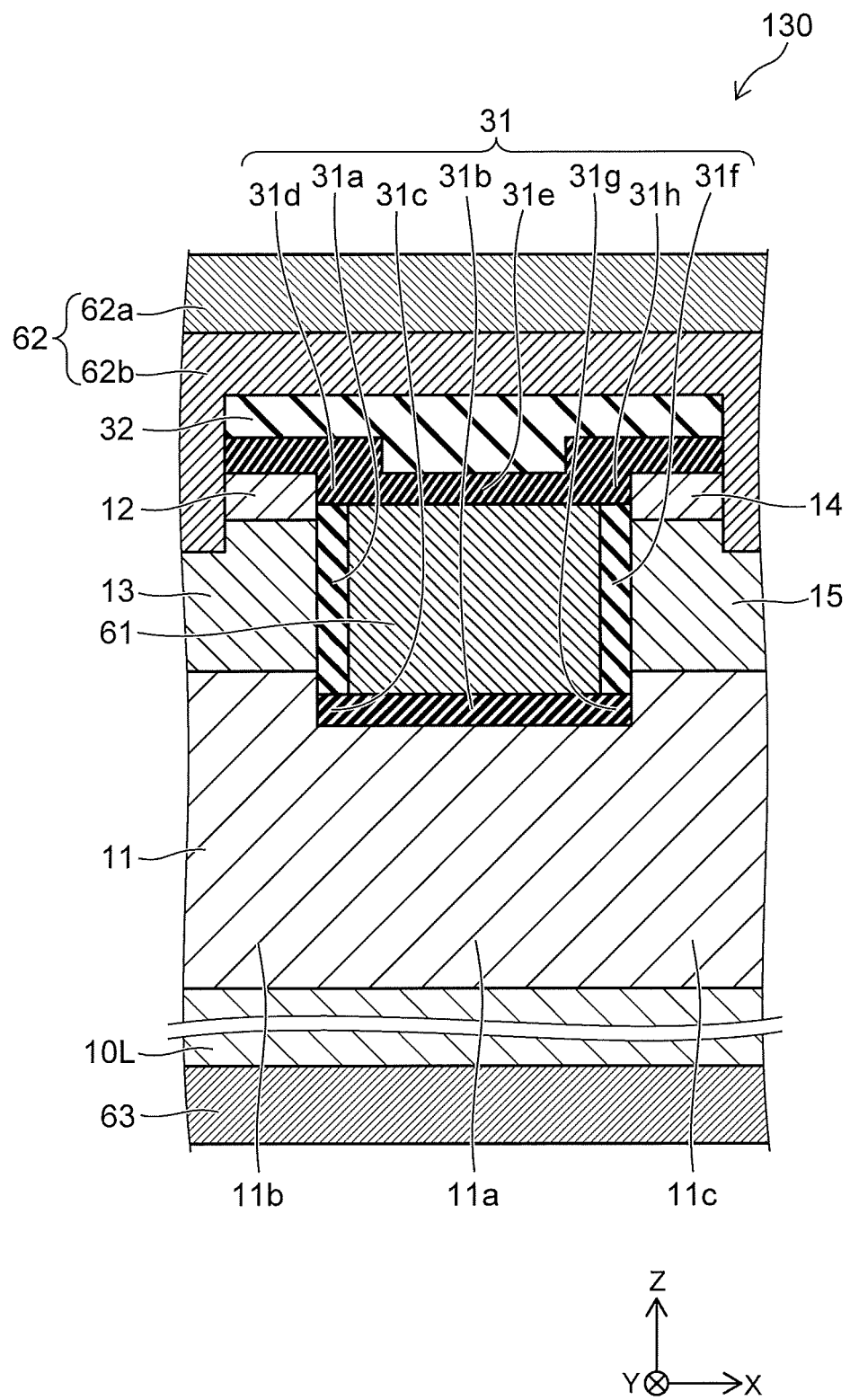
FIG. 7 is a schematic cross-sectional view illustrating a semiconductor device according to a third embodiment.

FIG. 7 is a schematic cross-sectional view illustrating a semiconductor device according to a third embodiment.

As shown in FIG. 7, the semiconductor device 130 includes the first to fifth semiconductor regions 11 to 15, the semiconductor layer 10L, the first to third electrodes 61 to 63, the first insulating portion 31, and the second insulating portion 32. The first insulating portion 31 includes the first to eighth insulating regions 31a to 31h.

In the embodiment, the first insulating region 31a and the third insulating region 31c satisfy at least one of the first to fifth conditions recited above. The first insulating region 31a and the fourth insulating region 31d satisfy at least one of the sixth to tenth conditions recited above.

In the embodiment, the third insulating region 31c that satisfies at least one of the first to fifth conditions and the fourth insulating region 31d that satisfies at least one of the sixth to tenth conditions can suppress the diffusion of hydrogen better than the first insulating region 31a. By providing the third insulating region 31c and the fourth insulating region 31d, the characteristics of the semiconductor device can be more stable than in the case where the third insulating region 31c and the fourth insulating region 31d are not provided. For example, the shift of the threshold voltage to the negative side is suppressed further. The first insulating region 31a also may be able to suppress the diffusion of hydrogen.

In the embodiment, for example, the sixth insulating region 31f and the seventh insulating region 31g satisfy at least one of the eleventh to fifteenth conditions recited above. For example, the sixth insulating region 31f and the eighth insulating region 31h satisfy at least one of the sixteenth to twentieth conditions recited above. For example, the first insulating region 31a and the second insulating region 31b satisfy at least one of the twenty-first to twenty-fifth conditions recited above. For example, the first insulating region 31a and the fifth insulating region 31e satisfy at least one of the twenty-sixth to thirtieth conditions recited above.

In the embodiment, the composition of the third insulating region 31c may be substantially the same as the composition of the fourth insulating region 31d. The concentration of nitrogen in the third insulating region 31c may be substantially the same as the concentration of nitrogen in the fourth insulating region 31d. The concentration of the first metal in the third insulating region 31c may be substantially the same as the concentration of the second metal in the fourth insulating region 31d. The first metal and the second metal may be the same.

In the embodiment, the composition of the seventh insulating region 31g may be substantially the same as the composition of the eighth insulating region 31h. The concentration of nitrogen in the seventh insulating region 31g may be substantially the same as the concentration of nitrogen in the eighth insulating region 31h. The concentration of the first metal in the seventh insulating region 31g may be substantially the same as the concentration of the second metal in the eighth insulating region 31h. The first metal and the second metal may be the same.

In the embodiment, the composition of the second insulating region 31b may be substantially the same as the composition of the fifth insulating region 31e. The concentration of nitrogen in the second insulating region 31b may be substantially the same as the concentration of nitrogen in the fifth insulating region 31e. The concentration of the first metal in the second insulating region 31b may be substantially the same as the concentration of the second metal in the fifth insulating region 31e. The first metal and the second metal may be the same.

For example, the semiconductor device 130 can be manufactured by a method that combines the method for manufacturing the semiconductor device 110 described above and the method for manufacturing the semiconductor device 120 described above.

Figure 8:
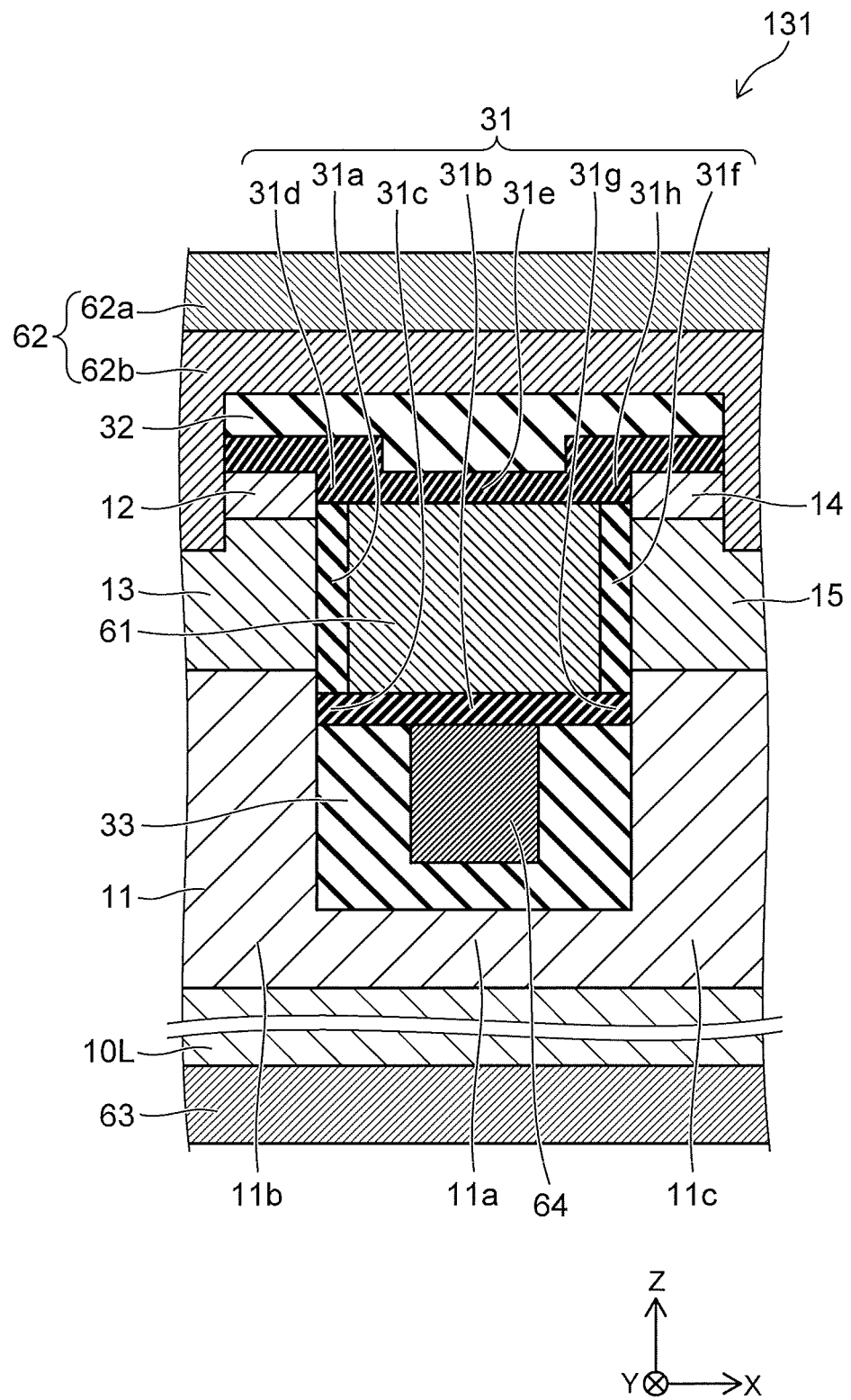
FIG. 8 is a schematic cross-sectional view illustrating another semiconductor device according to the third embodiment.

FIG. 8 is a schematic cross-sectional view illustrating another semiconductor device according to the third embodiment.

As shown in FIG. 8, the semiconductor device 131 further includes the third insulating portion 33 and the fourth electrode 64. In the first direction (the Z-axis direction), the third insulating portion 33 is provided between the first partial region 11a and the second insulating region 31b and between the first partial region 11a and the third insulating region 31c. The fourth electrode 64 is provided between the second insulating region 31b and the third insulating portion 33 in the first direction (the Z-axis direction). A portion of the third insulating portion 33 is positioned between the second partial region 11b and the fourth electrode 64 in the second direction (the X-axis direction). Otherwise, the semiconductor device 131 is similar to the semiconductor device 130 shown in FIG. 7. For example, the fourth electrode 64 functions as the second source electrode. In such a case, for example, the fourth electrode 64 is electrically connected to the second electrode 62. For example, the third insulating portion 33 functions as an inter-layer insulating film.

For example, the semiconductor device 131 can be manufactured by a method that combines the method for manufacturing the semiconductor device 111 described above and the method for manufacturing the semiconductor device 121 described above.

According to the embodiments, a semiconductor device can be provided in which the characteristics can be stabilized.

In this specification, the "state of being electrically connected" includes the state in which multiple conductive bodies are physically in contact, and a current flows between the multiple conductive bodies. The "state of being electrically connected" includes the state in which another conductive body is inserted between multiple conductive bodies, and a current flows between the multiple conductive bodies.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor region including a first partial region and a second partial region and being of a first conductivity type;
a second semiconductor region of the first conductivity type, a first direction from the second partial region toward the second semiconductor region crossing a second direction from the second partial region toward the first partial region;
a third semiconductor region provided between the second partial region and the second semiconductor region in the first direction, the third semiconductor region being of a second conductivity type;
a first electrode, a direction from the third semiconductor region toward the first electrode being aligned with the second direction;
a second electrode electrically connected to the second semiconductor region;
a third electrode electrically connected to the first semiconductor region; and
a first insulating portion including
a first insulating region provided between the third semiconductor region and the first electrode in the second direction,
a second insulating region provided between the first partial region and the first electrode in the first direction, and
a third insulating region provided between the first partial region and the first insulating region in the first direction,
the first insulating region and the third insulating region satisfying at least one of first to fifth conditions,
in the first condition, the third insulating region includes nitrogen, and the first insulating region does not include nitrogen,
in the second condition, the first insulating region and the third insulating region include nitrogen, and a concentration of nitrogen in the first insulating region is lower than a concentration of nitrogen in the third insulating region,
in the third condition, the third insulating region includes a first metal, the first insulating region does not include the first metal, and the first metal is at least one selected from the group consisting of Al Ti, Mg, Zr, Ta, Ce, Ir, Ru, Re, and Sr,
in the fourth condition, the first insulating region and the third insulating region include the first metal, and a concentration of the first metal in the first insulating region is lower than a concentration of the first metal in the third insulating region,
in the fifth condition, the first insulating region includes $SiO_{z1}$, and the third insulating region includes $SiO_{z2}$ ($z1<z2$),
wherein
the third insulating region includes a first compound, the first compound being at least one selected from the group consisting of $Si_3N_4$, AlN, WN, $Al_xO_y$, $TiO_x$, $MgO_x$, $ZrO_x$, $Ta_5O_3$, $CeO_2$, $IrO_x$, $RuO_x$, $ReO_x$, $Al_xSi_yO_z$, $MgTiO_x$, and $SrRuO_3$, and
the first insulating region does not include the first compound, or the first insulating region includes the first compound, and a concentration of the first compound in the first insulating region is lower than a concentration of the first compound in the third insulating region.

2. A semiconductor device, comprising:
a first semiconductor region including a first partial region and a second partial region and being of a first conductivity type;
a second semiconductor region of the first conductivity type, a first direction from the second partial region toward the second semiconductor region crossing a second direction from the second partial region toward the first partial region;
a third semiconductor region provided between the second partial region and the second semiconductor region in the first direction, the third semiconductor region being of a second conductivity type;
a first electrode, a direction from the third semiconductor region toward the first electrode being aligned with the second direction;
a second electrode electrically connected to the second semiconductor region;
a third electrode electrically connected to the first semiconductor region; and
a first insulating portion including
a first insulating region provided between the third semiconductor region and the first electrode in the second direction,
a second insulating region provided between the first partial region and the first electrode in the first direction, and
a third insulating region provided between the first partial region and the first insulating region in the first direction,
the first insulating region and the third insulating region satisfying at least one of first to fifth conditions,
in the first condition, the third insulating region includes nitrogen, and the first insulating region does not include nitrogen,
in the second condition, the first insulating region and the third insulating region include nitrogen, and a concentration of nitrogen in the first insulating region is lower than a concentration of nitrogen in the third insulating region,
in the third condition, the third insulating region includes a first metal, the first insulating region does not include the first metal, and the first metal is at least one selected from the group consisting of Al, Ti, Mg, Zr, Ta, Ce, Ir, Ru, Re, and Sr,
in the fourth condition, the first insulating region and the third insulating region include the first metal, and a concentration of the first metal in the first insulating region is lower than a concentration of the first metal in the third insulating region,
in the fifth condition, the first insulating region includes $SiO_{z1}$, and the third insulating region includes $SiO_{z2}$ ($z1<z2$),
wherein
the first insulating region and the second insulating region satisfy at least one of twenty-first to twenty-fifth conditions,
in the twenty-first condition, the second insulating region includes nitrogen, and the first insulating region does not include nitrogen, in the twenty-second condition, the first insulating region and the second insulating region include nitrogen, and a concentration of nitrogen in the first insulating region is lower than a concentration of nitrogen in the second insulating region, in the twenty-third condition, the second insulating region includes the first metal, and the first insulating region does not include the first metal, in the twenty-fourth condition, the first insulating region and the second insulating region include the first metal, and a concentration of the first metal in the first insulating region is lower than a concentration of the first metal in the second insulating region, and in the twenty-fifth condition, the first insulating region includes $SiO_{z1}$, and the second insulating region includes $SiO_{z2}$ ($z1<z2$).

3. A semiconductor device, comprising:

a first semiconductor region including a first partial region and a second partial region and being of a first conductivity type;

a second semiconductor region of the first conductivity type, a first direction from the second partial region toward the second semiconductor region crossing a second direction from the second partial region toward the first partial region;

a third semiconductor region provided between the second partial region and the second semiconductor region in the first direction, the third semiconductor region being of a second conductivity type;

a first electrode, a direction from the third semiconductor region toward the first electrode being aligned with the second direction;

a second electrode electrically connected to the second semiconductor region;

a third electrode electrically connected to the first semiconductor region; and a first insulating portion including a first insulating region provided between the third semiconductor region and the first electrode in the second direction, a second insulating region provided between the first partial region and the first electrode in the first direction, a third insulating region provided between the first partial region and the first insulating region in the first direction, and a fourth insulating region, the first insulating region being positioned between the third insulating region and the fourth insulating region in the first direction, the first insulating region and the fourth insulating region satisfying at least one of sixth to tenth conditions, in the sixth condition, the fourth insulating region includes nitrogen, and the first insulating region does not include nitrogen, in the seventh condition, the first insulating region and the fourth insulating region include nitrogen, and a concentration of nitrogen in the first insulating region is lower than a concentration of nitrogen in the fourth insulating region, in the eighth condition, the fourth insulating region includes a second metal, the first insulating region does not include the second metal, and the second metal is at least one selected from the group consisting of Al, Ti, Mg, Zr, Ta, Ce, Ir, Ru, Re, and Sr, in the ninth condition, the first insulating region and the fourth insulating region include the second metal, and a concentration of the second metal in the first insulating region is lower than a concentration of the second metal in the fourth insulating region, in the tenth condition, the first insulating region includes $SiO_{z1}$, and the fourth insulating region includes $SiO_{z2}$ ($z1<z2$), wherein the fourth insulating region includes a first compound, the first compound being at least one selected from the group consisting of $Si_3N_4$, AlN, WN, $Al_xO_y$, $TiO_x$, $MgO_x$, $ZrO_x$, $Ta_5O_3$, $CeO_2$, $IrO_x$, $RuO_x$, $ReO_x$, $Al_xSi_yO_z$, $MgTiO_x$, and $SrRuO_3$, and the first insulating region does not include the first compound, or the first insulating region includes the first compound, and a concentration of the first compound in the first insulating region is lower than a concentration of the first compound in the fourth insulating region.

4. The device according to claim 3, wherein the first insulating region and a fifth insulating region satisfy at least one of twenty-sixth to thirtieth conditions, the fifth insulating region is provided between the first electrode and the second electrode in the first direction, in the twenty-sixth condition, the fifth insulating region includes nitrogen, and the first insulating region does not include nitrogen, in the twenty-seventh condition, the first insulating region and the fifth insulating region include nitrogen, and a concentration of nitrogen in the first insulating region is lower than a concentration of nitrogen in the fifth insulating region, in the twenty-eighth condition, the fifth insulating region includes the second metal, and the first insulating region does not include the second metal, in the twenty-ninth condition, the first insulating region and the fifth insulating region include the second metal, and a concentration of the second metal in the first insulating region is lower than a concentration of the second metal in the fifth insulating region, and in the thirtieth condition, the first insulating region includes $SiO_{z1}$, and the fifth insulating region includes $SiO_{z2}$ ($z1<z2$).

5. The device according to claim 3, wherein the first insulating region and the third insulating region satisfy at least one of first to fifth conditions, in the first condition, the third insulating region includes nitrogen, and the first insulating region does not include nitrogen, in the second condition, the first insulating region and the third insulating region include nitrogen, and a concentration of nitrogen in the first insulating region is lower than a concentration of nitrogen in the third insulating region, in the third condition, the third insulating region includes a first metal, the first insulating region does not include the first metal, and the first metal is at least one selected from the group consisting of Al, Ti, Mg, Zr, Ta, Ce, Ir, Ru, Re, and Sr, in the fourth condition, the first insulating region and the third insulating region include the first metal, and a concentration of the first metal in the first insulating region is lower than a concentration of the first metal in the third insulating region, and in the fifth condition, the first insulating region includes $SiO_{z1}$, and the third insulating region includes $SiO_{z2}$ ($z1<z2$).

6. The device according to claim 5, wherein
the first insulating region and the second insulating region satisfy at least one of twenty-first to twenty-fifth conditions,
in the twenty-first condition, the second insulating region includes nitrogen, and the first insulating region does not include nitrogen,
in the twenty-second condition, the first insulating region and the second insulating region include nitrogen, and a concentration of nitrogen in the first insulating region is lower than a concentration of nitrogen in the second insulating region,
in the twenty-third condition, the second insulating region includes the first metal, and the first insulating region does not include the first metal,
in the twenty-fourth condition, the first insulating region and the second insulating region include the first metal, and a concentration of the first metal in the first insulating region is lower than a concentration of the first metal in the second insulating region, and
in the twenty-fifth condition, the first insulating region includes $SiO_{z1}$, and the second insulating region includes $SiO_{z2}$ ($z1<z2$).

* * * * *